(12) United States Patent
Yun

(10) Patent No.: US 11,828,806 B2
(45) Date of Patent: Nov. 28, 2023

(54) APPARATUS AND METHOD FOR CALCULATING BATTERY POWER

(71) Applicant: LG Energy Solution, Ltd., Seoul (KR)

(72) Inventor: Seong Jun Yun, Daejeon (KR)

(73) Assignee: LG Energy Solution, Ltd.

( * ) Notice: Subject to any disclaimer, the term of this patent is extended or adjusted under 35 U.S.C. 154(b) by 0 days.

(21) Appl. No.: 17/631,920

(22) PCT Filed: Sep. 25, 2020

(86) PCT No.: PCT/KR2020/013023
§ 371 (c)(1),
(2) Date: Feb. 1, 2022

(87) PCT Pub. No.: WO2021/066396
PCT Pub. Date: Apr. 8, 2021

(65) Prior Publication Data
US 2022/0283232 A1    Sep. 8, 2022

(30) Foreign Application Priority Data
Oct. 1, 2019 (KR) .................. 10-2019-0121707

(51) Int. Cl.
*G01R 31/36* (2020.01)
*G01R 31/389* (2019.01)
*G01R 31/374* (2019.01)

(52) U.S. Cl.
CPC ....... *G01R 31/3648* (2013.01); *G01R 31/374* (2019.01); *G01R 31/389* (2019.01)

(58) Field of Classification Search
CPC .................. G01R 31/3648; G01R 31/389

USPC .......................................................... 702/63
See application file for complete search history.

(56) References Cited

U.S. PATENT DOCUMENTS

| 5,501,517 A | 3/1996 | Kiuchi |
| 2007/0145954 A1 | 6/2007 | Kawahara et al. |
| 2009/0174369 A1 | 7/2009 | Kawahara et al. |
| 2010/0079111 A1 | 4/2010 | Masuda |
| 2010/0185405 A1* | 7/2010 | Aoshima ................. B60L 58/22 |
| | | 702/63 |
| 2011/0257914 A1 | 10/2011 | Tsuchiya |

(Continued)

FOREIGN PATENT DOCUMENTS

| CN | 102933978 A | 2/2013 |
| CN | 106030965 A | 10/2016 |

(Continued)

OTHER PUBLICATIONS

International Search Report for PCTKR2020013023 dated Jan. 13, 2021, 2 pgs.

(Continued)

*Primary Examiner* — Ricky Go
(74) *Attorney, Agent, or Firm* — Lerner David LLP

(57) ABSTRACT

An apparatus for calculating battery power including a time setting unit that sets a target time for using a battery cell, a temperature sensor unit that measures temperature of the battery cell, a resistance calculation unit that calculates resistance of the battery cell, and a power calculation unit that calculates an optimum current value usable without exceeding threshold temperature of the battery cell during the target time, based on the temperature and resistance of the battery.

14 Claims, 9 Drawing Sheets

(56) References Cited

U.S. PATENT DOCUMENTS

| | | | |
|---|---|---|---|
| 2013/0080096 A1 | 3/2013 | Toki | |
| 2013/0325379 A1* | 12/2013 | Nakamura | G01R 31/3835 |
| | | | 702/63 |
| 2014/0111164 A1 | 4/2014 | Ohkawa et al. | |
| 2015/0025825 A1 | 1/2015 | Yoshida | |
| 2015/0104680 A1 | 4/2015 | Wang et al. | |
| 2015/0108950 A1 | 4/2015 | Yun | |
| 2016/0091573 A1* | 3/2016 | Shiraishi | G01R 31/389 |
| | | | 324/426 |
| 2016/0329612 A1 | 11/2016 | Jung | |
| 2017/0170666 A1 | 6/2017 | Watanabe et al. | |
| 2017/0256960 A1 | 9/2017 | Shin et al. | |
| 2018/0069272 A1 | 3/2018 | Seo et al. | |
| 2018/0261889 A1* | 9/2018 | Kusano | H01M 10/44 |
| 2018/0372803 A1 | 12/2018 | Yoshida | |
| 2019/0064282 A1 | 2/2019 | Haga et al. | |
| 2019/0173136 A1 | 6/2019 | Seo et al. | |
| 2019/0288344 A1* | 9/2019 | Nakao | H01M 10/425 |

FOREIGN PATENT DOCUMENTS

| | | |
|---|---|---|
| CN | 107408827 A | 11/2017 |
| JP | 2006-304572 A | 11/2006 |
| JP | 2007-165211 A | 6/2007 |
| JP | 2009-207312 A | 9/2009 |
| JP | 2009244057 A | 10/2009 |
| JP | 2010-226894 A | 10/2010 |
| JP | 5126150 B2 | 1/2013 |
| JP | 5240320 B2 | 7/2013 |
| JP | WO2013128811 A1 | 7/2015 |
| JP | 2015-191777 A | 11/2015 |
| JP | 2015220956 A | 12/2015 |
| JP | 2017-103972 A | 6/2017 |
| JP | 2017117756 A | 6/2017 |
| JP | 2018-523891 A | 8/2018 |
| KR | 20120024009 A | 3/2012 |
| KR | 20150033081 A | 4/2015 |
| KR | 20150046638 A | 4/2015 |
| KR | 20160075167 A | 6/2016 |
| KR | 101685130 | 12/2016 |
| KR | 20170022758 A | 3/2017 |
| KR | 101925002 B1 | 12/2018 |
| KR | 101998069 B1 | 7/2019 |
| TW | 200623482 A | 7/2006 |
| WO | 2012-169063 A1 | 12/2012 |

OTHER PUBLICATIONS

Extended European Search Report including Written Opinion for Application No. 20871542.5 dated Jul. 26, 2022, pp. 1-9.

* cited by examiner (a)

(b)

APPARATUS AND METHOD FOR CALCULATING BATTERY POWER

CROSS-REFERENCE TO RELATED APPLICATIONS

The present application is a national phase entry under 35 U.S.C. § 371 of International Application No. PCT/KR2020/013023 filed Sep. 25, 2020, published in Korean, which claims priority from Korean Patent Application No. 10-2019-0121707, filed on Oct. 1, 2019, in the Korean Intellectual Property Office, all of which are incorporated herein by reference.

TECHNICAL FIELD

The present invention relates to an apparatus and method for calculating battery power usable without reaching limit temperature during a target time in consideration of heating and cooling conditions of a battery.

BACKGROUND

Recently, research and development on a secondary battery are being actively conducted. Here, the secondary battery is a battery capable of charging and discharging, and is meant to include all of a conventional Ni/Cd battery, Ni/MH battery, etc. and a recent lithium ion battery. Among the secondary batteries, the lithium ion battery has an advantage of having much higher energy density compared to the conventional Ni/Cd battery, Ni/MH battery, etc. In addition, the lithium ion battery can be manufactured in a small size and light weight, and thus the lithium ion battery is used as a power source for a mobile device. In addition, the lithium ion battery is attracting attention as a next-generation energy storage medium as its range of use has been expanded to a power source for an electric vehicle.

In addition, the secondary battery is generally used as a battery pack including a battery module in which a plurality of battery cells are connected in series and/or in parallel. In addition, a state and operation of the battery pack are managed and controlled by a battery management system.

In such a battery management system, use power of a battery is generally calculated with conditions such as a current state of charge (SOC) or temperature as the reference. In this case, when the battery reaches the limit temperature while using the maximum power, power is collectively limited to a prescribed value. However, when power is used to the maximum until the limit temperature of the battery is reached, and then power is rapidly limited, there is a problem in that a vehicle cannot efficiently manage energy.

SUMMARY

Technical Problem

An object of the present invention is to provide an apparatus and method for calculating battery power capable of maintaining a battery at an appropriate temperature during the target time and efficiently performing energy management of a vehicle by calculating an optimum power value usable for the battery without reaching the limit temperature during the target time.

Technical Solution

An apparatus for calculating battery power according to an embodiment of the present invention includes a timer configured to set a target time for using a battery cell, a temperature sensor configured to measure a temperature of the battery cell, and a controller configured to calculate a resistance of the battery cell, and calculate a current value usable without exceeding threshold temperature of the battery cell during the target time, based on the measured temperature and calculated resistance of the battery cell.

The apparatus for calculating battery power according to the embodiment of the present invention may further include memory configured to store a parameter for calculating the current value of the battery cell.

In the apparatus for calculating battery power according to the embodiment of the present invention, the controller may be configured to correct the calculated resistance of the battery cell based at least in part on a change in resistance according to the temperature of the battery cell.

In the apparatus for calculating battery power according to the embodiment of the present invention, the controller may be configured to correct the calculated resistance of the battery cell based on a correction coefficient calculated according to a ratio between resistance at a current temperature of the battery cell and resistance at the threshold temperature of the battery cell.

In the apparatus for calculating battery power according to the embodiment of the present invention, the controller may be configured to correct the resistance of the battery cell in consideration of a change in resistance according to a state of charge (SOC) of the battery cell.

In the apparatus for calculating battery power according to the embodiment of the present invention, the controller may be configured to correct the resistance of the battery cell based on a correction coefficient calculated according to a ratio between resistance at a current SOC of the battery cell and resistance at an SOC of the battery cell after a preset time.

In the apparatus for calculating battery power according to the embodiment of the present invention, the threshold temperature may be a predetermined value or a value determined according to a then-current operation mode of a system including the battery cell.

In the apparatus for calculating battery power according to the embodiment of the present invention, the controller may be configured to calculate the current value based at least in part on a total amount of heat generated from a time that the battery cell is at a current temperature until a time that the battery cell reaches the threshold temperature.

In the apparatus for calculating battery power according to the embodiment of the present invention, the timer may be configured to set the target time in response to an input from a user or an external system.

A method for calculating battery power according to an embodiment of the present invention includes setting a target time for using a battery cell, measuring a temperature of the battery cell, calculating a resistance of the battery cell, and calculating a current value usable without exceeding a threshold temperature of the battery cell during the target time, based on the measured temperature and calculated resistance of the battery.

The method for calculating battery power according to the embodiment of the present invention may further include correcting the calculated resistance of the battery cell based at least in part on a change in resistance according to the temperature of the battery cell.

The method for calculating battery power according to the embodiment of the present invention may further include correcting the calculated resistance of the battery cell based at least in part on a change in resistance according to an SOC of the battery cell.

Effects of the Invention

According to the apparatus and method for calculating battery power according to the embodiment of the present invention, it is possible to maintain the battery at an appropriate temperature during the target time and efficiently perform energy management of the vehicle by calculating an optimum power value usable for the battery without reaching the limit temperature during the target time.

DETAILED DESCRIPTION

Figure 1:
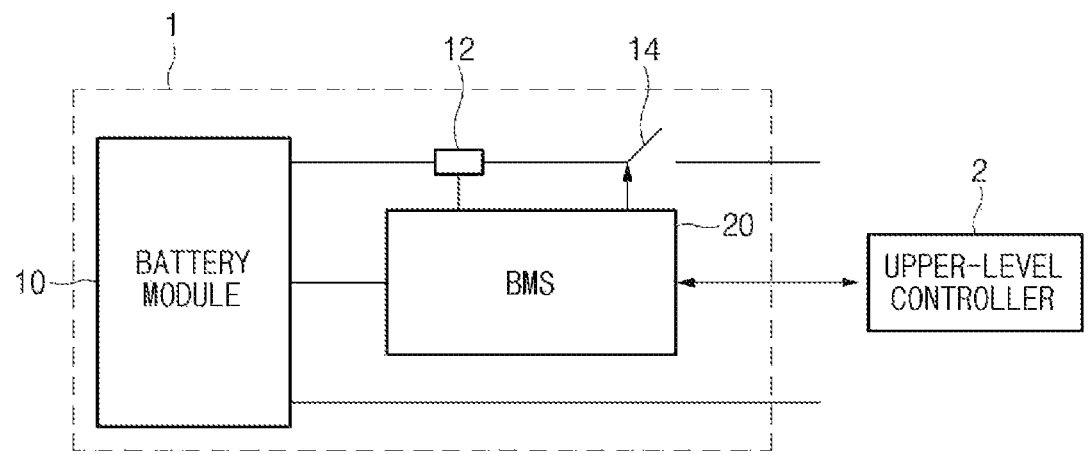
FIG. 1 is a block diagram illustrating a configuration of a battery control system.

Hereinafter, various embodiments of the present invention will be described in detail with reference to the accompanying drawings. In this document, the same reference numerals are used for the same constituent elements in the drawings, and duplicate descriptions for the same constituent elements are omitted.

With respect to the various embodiments of the present invention disclosed in this document, specific structural or functional descriptions have been exemplified for the purpose of describing the embodiments of the present invention only, and various embodiments of the present invention may be embodied in various forms and should not be construed as being limited to the embodiments described in this document.

Expressions such as "first", "second", "firstly", or "secondly", etc. used in various embodiments may modify various constituent elements regardless of order and/or importance, and do not limit corresponding constituent elements. For example, without deviating from the scope of the present invention, a first constituent element may be named as a second constituent element, and similarly, the second constituent element may also be renamed as the first constituent element.

The terms used in this document are only used to describe a specific embodiment, and may not be intended to limit the scope of other embodiments. Singular expressions may include plural expressions unless the context clearly indicates otherwise.

All terms used herein, including technical or scientific terms, may have the same meaning as generally understood by a person of ordinary skill in the art. Terms defined in a generally used dictionary may be interpreted as having the same or similar meaning as the meaning in the context of the related technology, and are not to be interpreted as an ideal or excessively formal meaning unless explicitly defined in this document. In some cases, even terms defined in this document cannot be interpreted to exclude embodiments of the present invention.

FIG. 1 is a block diagram illustrating a configuration of a battery control system.

Referring to FIG. 1, a battery management system (BMS) including a battery pack 1 and an upper-level controller 2 included in an upper-level system according to an embodiment of the present invention is schematically illustrated.

As illustrated in FIG. 1, the battery pack 1 includes a battery module 10 composed of one or more battery cells and capable of charging and discharging, a switching unit 14 connected in series to a positive terminal side or a negative terminal side of the battery module 10 to control a charge and discharge current flow of the battery module 10, and a battery management system 20 that monitors a voltage, current, temperature, etc. of the battery pack 1 to control and manage the battery module 10 to prevent over-charging, over-discharging, etc.

Here, the switching unit 14 is a semiconductor switching element for controlling a current flow for charging or discharging of the battery module 10, and, for example, at least one MOSFET may be used In addition, the BMS 20 may measure or calculate a voltage and current of a gate, source, and drain of the semiconductor switching element in order to monitor the voltage, current, temperature, etc. of the battery pack 1, and may measure the current, voltage, temperature, etc. of the battery pack using a sensor 12 provided adjacent to the semiconductor switching element 14. The BMS 20 is an interface that receives values obtained by measuring various parameters described above, and may include a plurality of terminals and a circuit connected to these terminals to perform processing for input values.

In addition, the BMS 20 may control ON/OFF of the switching element 14, for example, a MOSFET, and may be connected to the battery module 10 to monitor a state of the battery module 10.

The upper controller 2 may transmit a control signal for the battery module to the BMS 20. Accordingly, an operation of the BMS 20 may be controlled based on a signal applied from the host controller. The battery cell of the present invention may be configured to be included in a battery pack used in an energy storage system (ESS) or a vehicle, etc. However, the battery cell of the present invention is not limited to these uses.

Since the configuration of the battery pack 1 and the configuration of the BMS 20 are known configurations, a more detailed description thereof will be omitted.

Figure 2:
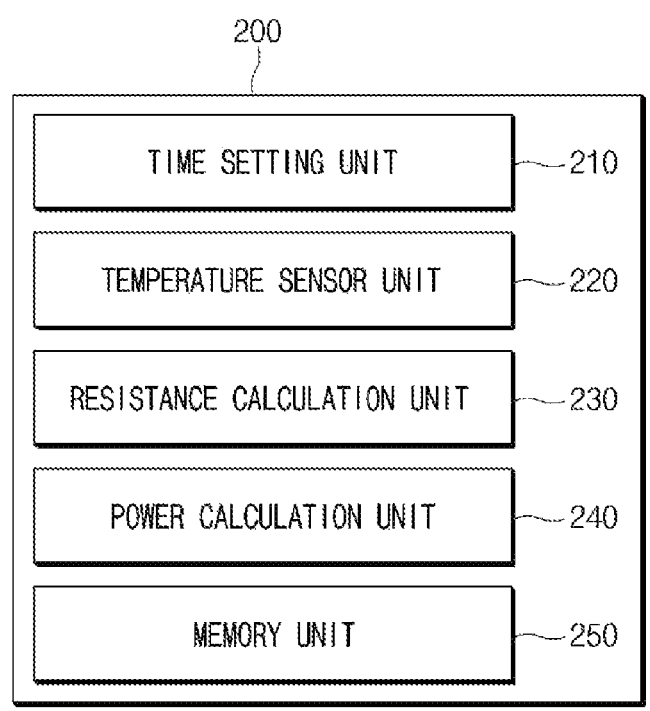
FIG. 2 is a block diagram illustrating a configuration of an apparatus for calculating battery power according to an embodiment of the present invention.

FIG. 2 is a block diagram illustrating a configuration of an apparatus for calculating battery power according to an embodiment of the present invention.

Referring to FIG. 2, an apparatus for calculating battery power 200 according to an embodiment of the present invention may include a time setting unit 210, a temperature sensor unit 220, a resistance calculation unit 230, a power calculation unit 240, and a memory unit 250.

The time setting unit 210 may set a target time for using the battery cell. Here, the target time is a time during which the battery cell can be used without reaching limit temperature, and may be arbitrarily set by the user. In this case, the time setting unit 210 may set the target time by receiving an input from a user or an external system.

In addition, the time setting unit 210 may receive a value calculated in real time according to an operation mode or navigation link information in a vehicle system as the target time. For example, the target time may be set in seconds (sec).

The temperature sensor unit 220 may measure temperature of the battery cell. In this case, the temperature sensor unit 220 may measure the temperature of the battery cell in real time or at a preset time interval.

The resistance calculation unit 230 may calculate the resistance of the battery cell. For example, the resistance calculation unit 230 may calculate resistance based on a voltage and a current applied to the battery cell.

In addition, the resistance calculation unit 230 may correct the resistance of the battery cell in consideration of a change in resistance according to the temperature of the battery cell. In this case, the resistance calculation unit 230 may correct the resistance of the battery cell based on a correction coefficient calculated according to a ratio of the resistance at current temperature of the battery cell and the resistance at threshold temperature (or other high temperature condition) of the battery cell. This will be described later with reference to FIG. 5.

The resistance calculation unit 230 may correct the resistance of the battery cell in consideration of a change in resistance according to a state of charge (SOC) of the battery cell. In this case, the resistance calculation unit 230 may correct the resistance of the battery cell based on a correction coefficient calculated according to a ratio of the resistance at a current SOC of the battery cell and the resistance at the SOC of the battery cell after a preset time.

For example, a resistance value according to the temperature of the battery cell and a resistance value according to the SOC may be values obtained in advance through an experiment or calculation. These values may be stored in the memory unit 250.

The power calculation unit 240 may calculate an optimum current value usable without exceeding the threshold temperature of the battery cell during the target time, based on the temperature and resistance of the battery. However, the present invention is not limited thereto, and the power calculation unit 240 may calculate an optimum voltage value in a range of optimum power usable without exceeding the threshold temperature of the battery cell during the target time. Here, the threshold temperature may be a predetermined value or a value calculated in real time according to an operation mode of a system including the battery cell.

The power calculation unit 240 may calculate the optimum current value in consideration of a total amount of heat from the current temperature of the battery cell to the threshold temperature, an amount of heat generation generated during charging and discharging of the battery cell, and an amount of cooling heat. This will be described later with reference to FIGS. 3 and 4.

The memory unit 250 may store a parameter for calculating the optimum current value of the battery cell. For example, parameter values may include mass of the battery cell, heat capacity of the battery cell, thermal resistance, a correction coefficient that reflects the change in resistance according to the temperature and SOC of the battery cell described above, a correction coefficient for calculating an amount of heat generation of the battery cell, etc. Also, the memory unit 250 may store the temperature, SOC, and resistance value of the battery cell.

As described above, according to the apparatus for calculating battery power according to the embodiment of the present invention, it is possible to maintain the battery at an appropriate temperature during the target time and efficiently perform energy management of the vehicle by calculating the optimum power value for using the battery without reaching the limit temperature during the target time.

Figure 3:
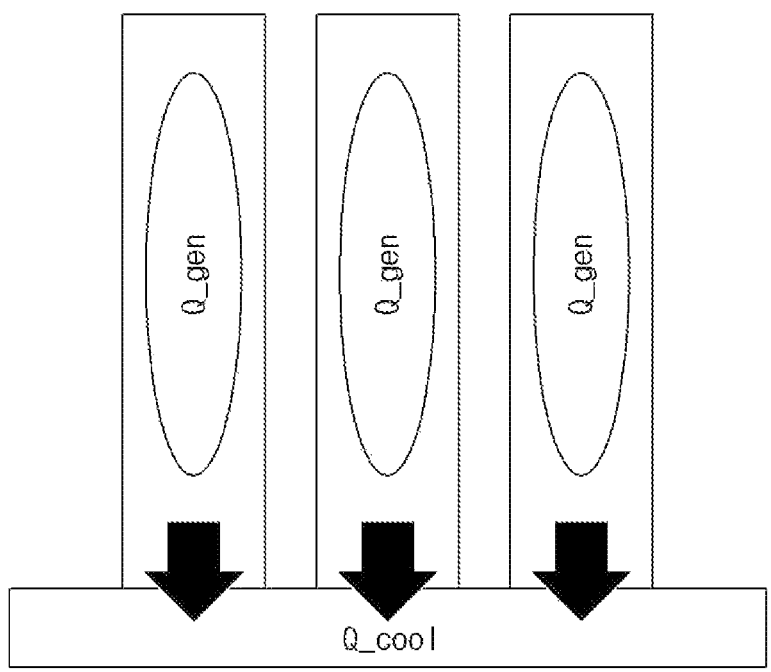
FIG. 3 is a diagram illustrating a thermal model for calculating an optimum power value of a battery.

FIG. 3 is a diagram illustrating a thermal model for calculating an optimum power value of a battery.

Referring to FIG. 3, it illustrates that a coolant is provided in a plurality of battery cells. In this case, the total amount of heat (Q_tot) from the current temperature until reaching the threshold temperature of the battery cell is equal to a value obtained by subtracting the amount of cooling heat (Q_cool) from the amount of heat generation of the battery cell (Q_gen) generated during charging and discharging. Based on this, a process of obtaining the optimum power value of the battery cell will be described with reference to FIG. 4.

Figure 4:
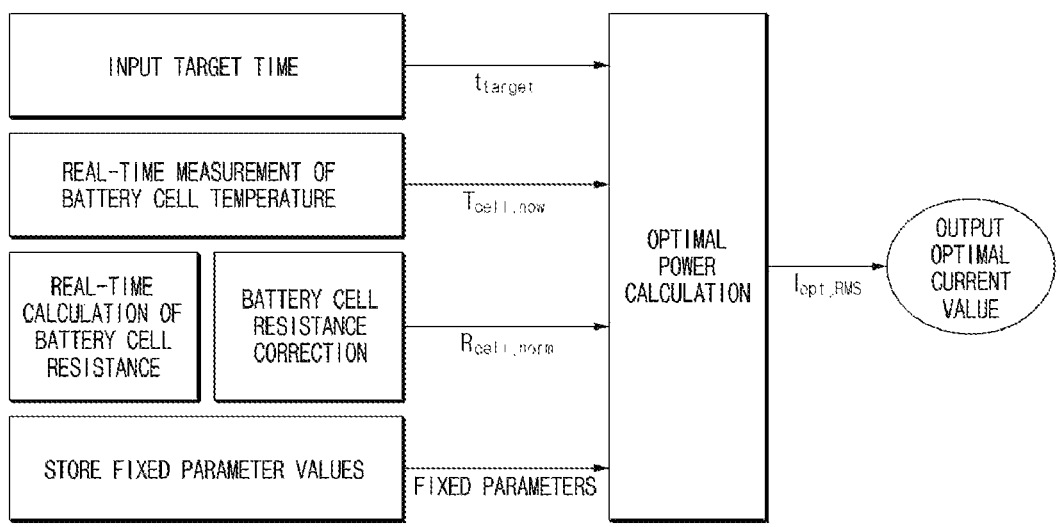
FIG. 4 is a diagram schematically illustrating a process of calculating the optimum power value in the apparatus for calculating battery power according to an embodiment of the present invention.

FIG. 4 is a diagram schematically illustrating a process of calculating an optimum power value in the apparatus for calculating battery power according to an embodiment of the present invention.

Referring to FIG. 4, in order to calculate the optimum power of the battery in the apparatus for calculating battery power according to the embodiment of the present invention, the user first inputs a target time $t_{target}$ for using the battery without reaching the limit temperature.

In addition, temperature $T_{cell,now}$ of the battery cell is measured in real time and a resistance value $R_{cell,norm}$ of the battery cell is calculated. In this case, as described above, the resistance of the battery cell may be corrected in consideration of the temperature and SOC of the battery cell. Then, in order to calculate the optimum power of the battery, fixed parameters (e.g., heat capacity, mass, various correction coefficients of the battery cell, etc.) stored in the memory are introduced into a calculation expression.

Through this process, the apparatus for calculating battery power according to the embodiment of the present invention may calculate optimum power, and may drive the battery by outputting an optimum current value $I_{opt,RMS}$ for operating at optimum power.

Specifically, a process of deriving an expression for calculating the optimum current value is as follows.

The total amount of heat $Q_{tot}$ when the battery cell reaches the threshold temperature $T_{cell,limit}$ from the current temperature $T_{cell,now}$ can be calculated as follows.

$$Q_{tot} = C_{cell} \times m_{cell} \times (T_{cell,limit} - T_{cell,now}) \quad \text{Expression (1)}$$

$C_{cell}$ represents the heat capacity of the battery cell, and $m_{cell}$ represents the mass of the battery cell, which may be values stored in the memory. In addition, the threshold temperature $T_{cell,limit}$ may also be a value stored in the memory as a predetermined value, and the current temperature $T_{cell,now}$ may be a measured value by a sensor (e.g., temperature sensor unit 220 of FIG. 2) of the battery management system BMS. However, as described above, the threshold temperature $T_{cell,limit}$ may not be a fixed value but may be a value calculated in real time according to the operation mode of the system including the battery cell. In this case, the threshold temperature $T_{cell,limit}$ may be separately calculated by the battery management system BMS.

Meanwhile, the total amount of heat $Q_{tot}$ of the battery is equal to the value obtained by subtracting the amount of cooling heat $Q_{cool}$ from the amount of heat generation $Q_{gen}$ of the battery cell generated during charging and discharging.

$$Q_{tot}=Q_{gen}-Q_{cool} \quad \text{Expression (2)}$$

In addition, the amount of heat generation $Q_{gen}$ of the battery cell may be calculated as follows.

$$Q_{gen}=\alpha \times I_{opt,RMS}^2 \times R_{cell,norm} \times t_{target} \quad \text{Expression (3)}$$

$\alpha$ may be a value stored in the memory as a correction coefficient, $I_{opt,RMS}$ is an RMS value A of the optimum current to be calculated, and $R_{cell,norm}$ represents the resistance of the battery cell.

The battery cell resistance value $R_{cell,norm}$ required to calculate the amount of heat generation $Q_{gen}$ is a value that can represent the battery cell resistance up to the high temperature conditions, and may be used by being corrected as follows to suit the high temperature conditions from a resistance value $R_{cell,est}$ measured in real time by the battery management system (BMS).

$$R_{cell,norm}=k \times R_{cell,est} \quad \text{Expression (4)}$$

Here, k is a correction coefficient suitable for high temperature conditions (k<1), and the battery cell resistance may vary according to the current temperature conditions at which the battery cell resistance is measured.

In addition, as described above, the resistance value of the battery cell may include not only the correction coefficient k according to the temperature condition, but also a correction coefficient k' according to a main used SOC region. Here, k' may be around 1 in a charge sustain (CS) mode to be described later, and may be greater than 1 in a charge depletion (CD) mode. In this case, the correction coefficients k and k' according to the temperature and SOC may be values stored in the memory. As such, when applying the correction coefficient according to the SOC, Expression (4) described above may be expressed as follows.

$$R_{cell,norm}=k \times k' \times R_{cell,est} \quad \text{Expression (4')}$$

Meanwhile, the cooling heat $Q_{cool}$ of the battery cell may be calculated as follows.

$$Q_{cool} = \frac{\frac{T_{cell,limit}+T_{cell,now}}{2} - T_{coolant}}{R_{th}} \times t_{target} \quad \text{Expression (5)}$$

In this case, $$\frac{T_{cell,limit}+T_{cell,now}}{2}$$

was used to use the temperature of the battery cell on average, and $T_{coolant}$ represents the temperature of the coolant. In addition, $R_{th}$ represents thermal resistance, and $t_{target}$ is the time (target time) s during which the current may be used without exceeding the threshold temperature $T_{cell,limit}$. In this case, $R_{th}$, $T_{coolant}$, and $T_{cell,limit}$ may be stored in the memory as fixed values.

If Expression (1), Expression (3), and Expression (5) are respectively substituted in Expression (2) described above, it is as follows.

$$\text{Expression (6)}$$

$$C_{p,cell}m_{cell}(T_{cell,limit}-T_{cell,now}) =$$

$$\alpha I_{opt,RMS}^2 R_{cell,norm} - \frac{\frac{T_{cell,limit}+T_{cell,now}}{2} - T_{coolant}}{R_{th}} \times t_{target}$$

If Expression (6) described above is summarized for $I_{opt,RMS}$, it is as follows, which is the final expression implemented in the apparatus for calculating battery power (or BMS) according to the embodiment of the present invention.

$$\text{Expression (7)}$$

$$I_{opt,RMS} =$$

$$\sqrt{\frac{C_{p,cell}(T_{cell,max}-T_{cell,now})}{\alpha R_{cell,norm}} + \frac{\frac{T_{cell,limit}+T_{cell,now}}{2} - T_{coolant}}{\alpha R_{cell,norm}R_{th}} \times t_{target}}$$

Since the values stored in the memory described above are predetermined values, $I_{opt,RMS}$ may be regarded as a function by the following factors.

$$I_{opt,RMS}=f(t_{target},T_{cell,now},R_{cell,norm}) \quad \text{Expression (8)}$$

As such, the optimum RMS current $I_{opt,RMS}$ in a range not reaching the threshold temperature during the target time $t_{target}$ may be calculated by using the battery cell temperature $T_{cell,now}$ and resistance $R_{cell,norm}$ at the point in time of calculation, including the target time $t_{target}$ as input values.

Figure 5:
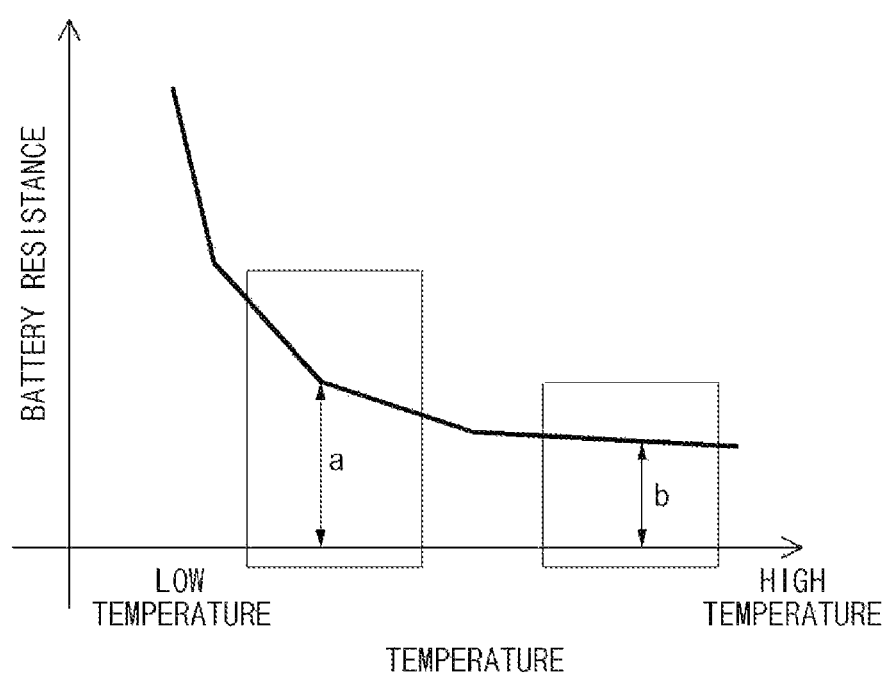
FIG. 5 is a diagram illustrating a change in battery resistance according to temperature.

FIG. 5 is a diagram illustrating a change in battery resistance according to temperature.

Referring to FIG. 5, it can be seen that the resistance of the battery tends to decrease as the temperature increases. That is, since the battery generally increases in temperature as use time increases, the resistance of the battery may gradually decrease. Accordingly, in the apparatus for calculating battery power according to the embodiment of the present invention, the correction coefficient may be calculated as follows by reflecting such a resistance characteristic of the battery.

$$k = \frac{b}{a} (<1) \quad \text{Expression (9)}$$

Here, a is the battery resistance at the current temperature, and b is the battery resistance in a high temperature state (e.g., threshold temperature) after a prescribed time. However, the correction coefficient of resistance according to temperature is not limited to the expression described above, and may be calculated in various ways.

Figure 6:
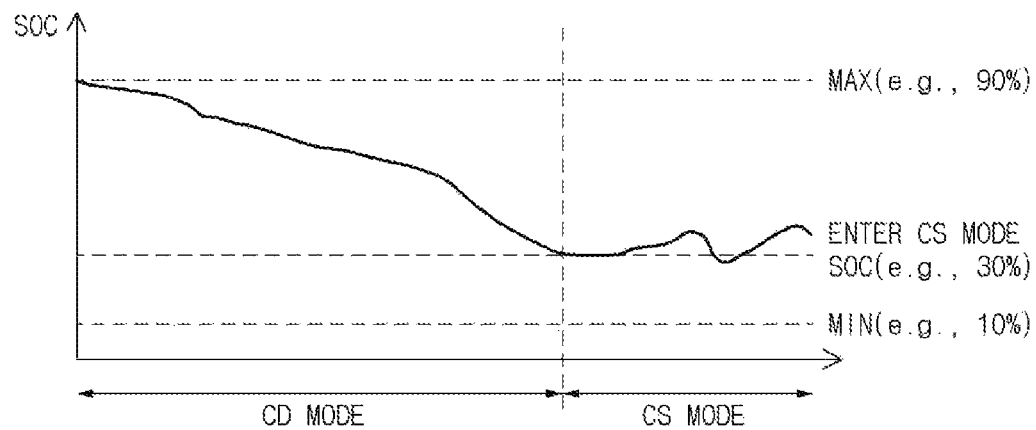
FIG. 6 is a diagram illustrating a change in SOC according to an operation of a battery and a change in battery resistance according to the SOC.
Figure 6:
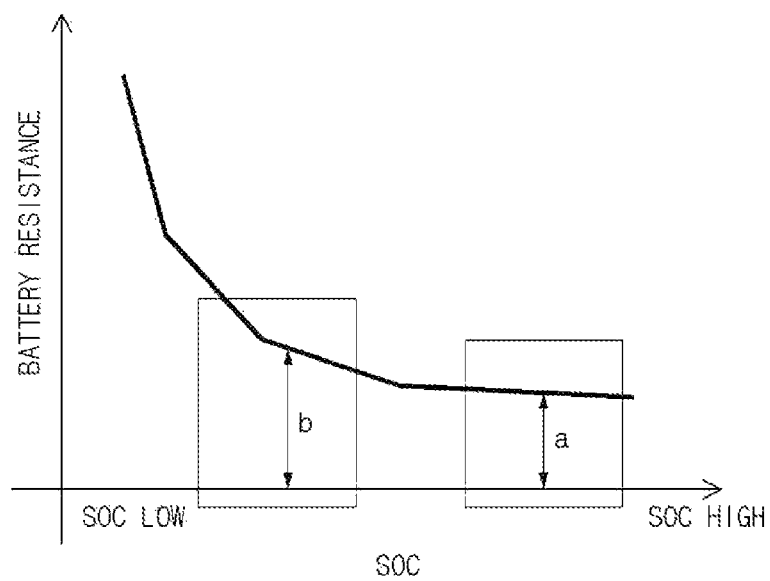

FIG. 6 is a diagram illustrating a change in SOC according to an operation of a battery and a change in battery resistance according to the SOC.

Referring to (a) of FIG. 6, the SOC of the battery cell may be divided into two modes according to an operating state. Specifically, in an initial SOC, the SOC gradually decreases as the battery is more actively used (discharged), and this is referred to as a charge depletion (CD) mode. In addition, when the SOC reaches a prescribed level (for example, 30%), it maintains the SOC by equalizing the use amount (discharging amount) and charging amount of the battery through regenerative braking, which is called a charge sustain (CS) mode.

Meanwhile, (b) of FIG. 6 illustrates a change in battery resistance according to the SOC in the CD mode (during discharging) described above. As can be seen from the graph, the resistance of the battery tends to decrease as the SOC increases. That is, the SOC of a battery generally decreases as the use time increases, and conversely, the resistance of the battery may gradually increase. Accordingly, in the apparatus for calculating battery power according to the embodiment of the present invention, the correction coefficient may be calculated as follows by reflecting such a resistance characteristic of the battery.

$$k' = \frac{b}{a}(>1) \qquad \text{Expression (10)}$$

Here, a is the battery resistance at the current SOC, and b is the battery resistance in a state where the SOC is decreased after a prescribed time. Meanwhile, in the CS mode, since the SOC is kept constant, there is no difference between the resistance value at the point in time of measurement and after the measurement, and thus k'=1. However, the correction coefficient of resistance according to the SOC is not limited to the expression described above, and may be calculated in various ways.

Figure 7:
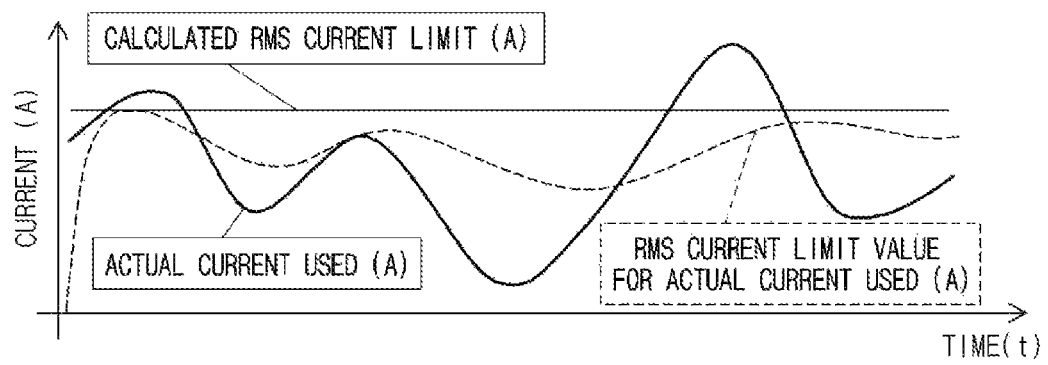
FIG. 7 is a diagram illustrating a change in battery current by the apparatus for calculating battery power according to the embodiment of the present invention.

FIG. 7 is a diagram illustrating a change in battery current by the apparatus for calculating battery power according to the embodiment of the present invention.

Referring to FIG. 7, it can be seen that, according to the apparatus for calculating battery power according to an embodiment of the present invention, the battery current is applied within the range of the calculated limit value of the RMS current. That is, in the apparatus for calculating battery power according to an embodiment of the present invention, compared to the case of managing power by using the measured value of the dynamically changing current used in the vehicle as an input value, the output may be statically managed in the vehicle by providing an appropriate RMS current value for the arrival time t of the threshold temperature to a control unit (e.g., electronic control unit (ECU)) of the vehicle.

As such, that is, according to the apparatus for calculating battery power according to the embodiment of the present invention, since the output can be managed at its optimum within the range where the current value of the RMS maintains the reference value, a margin for using a large current may be secured as much as the amount of using less current in the initial time.

Figure 8:
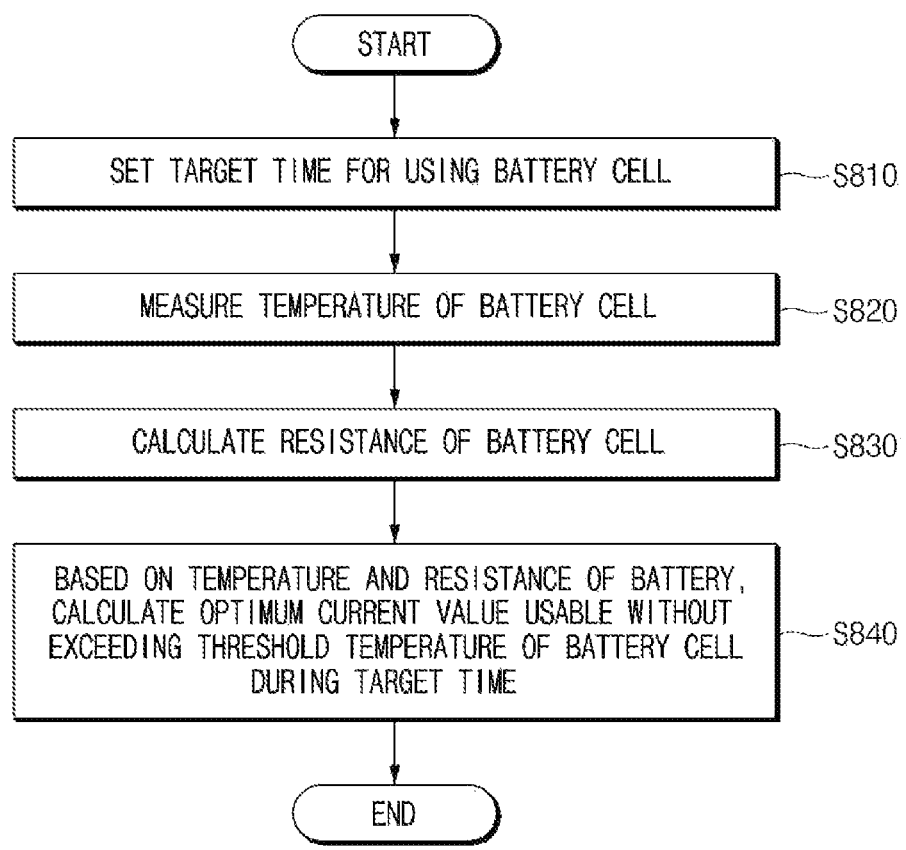
FIG. 8 is a flowchart illustrating a method for calculating battery power according to an embodiment of the present invention.

FIG. 8 is a flowchart illustrating a method for calculating battery power according to an embodiment of the present invention.

Referring to FIG. 8, first, a target time for using a battery cell may be set (S810). The target time is a time during which the user uses the battery without reaching threshold temperature of the battery cell, and may be set by the user. In this case, as the target time, a value calculated in real time according to an operation mode or navigation link information in a vehicle system may be received.

In addition, the threshold temperature may be a value determined in advance and stored in a memory, or may be a value calculated in real time according to an operation mode of a system including the battery cell.

Then, the temperature of the battery cell may be measured (S820), and the resistance of the battery cell may be calculated (S830). However, contrary to that illustrated in FIG. 8, the resistance of the battery cell may be calculated first and then the temperature of the battery cell may be measured.

Next, based on the temperature and resistance of the battery, an optimum current value usable without exceeding the threshold temperature of the battery cell during the target time may be calculated (S840). In this case, the optimum current value may be calculated in consideration of the total amount of heat from the current temperature of the battery cell until reaching the threshold temperature, the amount of heat generation generated during charging and discharging of the battery cell, and the amount of cooling heat. In addition, various parameters (e.g., heat capacity of the battery, thermal resistance, various correction coefficients, etc.) required to calculate the optimum current value may be stored in a separate memory.

Meanwhile, although not illustrated in FIG. 8, the method for calculating battery power according to the embodiment of the present invention may further include correcting the resistance of the battery cell in consideration of a change in resistance according to the temperature of the battery cell. In this case, as described above, the resistance of the battery cell may be corrected based on a correction coefficient calculated according to a ratio of the resistance at the current temperature of the battery cell and the resistance at the threshold temperature of the battery cell.

In addition, the method for calculating battery power according to the embodiment of the present invention may further include correcting the resistance of the battery cell in consideration of a change in resistance according to the SOC of the battery cell. In this case, the resistance of the battery cell may be corrected based on a correction coefficient calculated according to a ratio of the resistance at the current SOC of the battery cell and the resistance at the SOC after a preset time of the battery cell.

As such, according to the method for calculating battery power according to the embodiment of the present invention, it is possible to maintain the battery at an appropriate temperature during the target time and efficiently perform energy management of the vehicle by calculating the optimum power value for using the battery without reaching the limit temperature during the target time.

Figure 9:
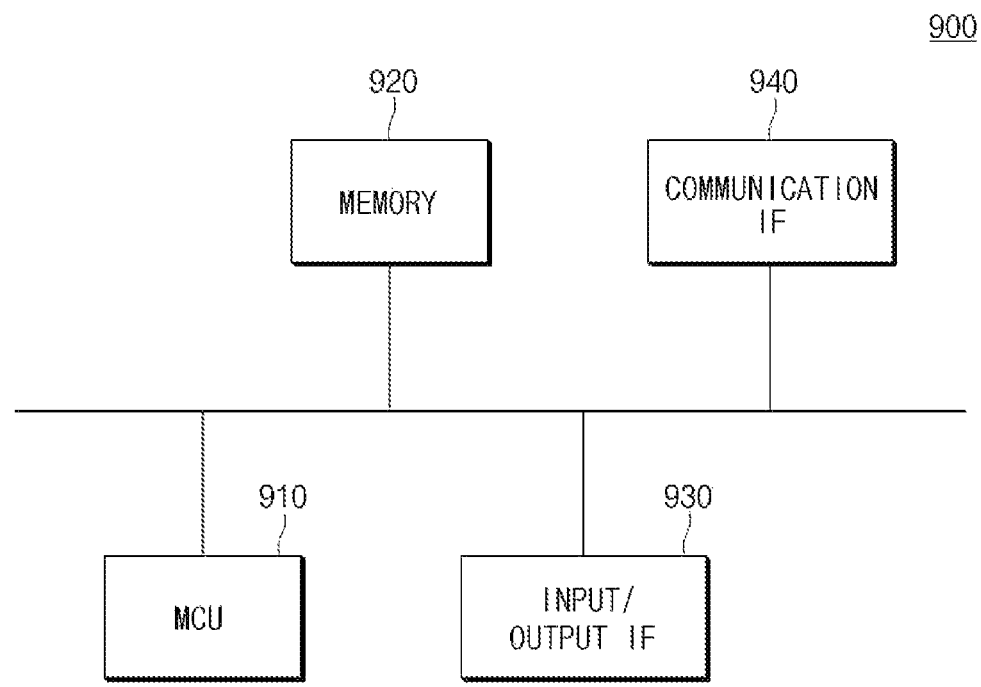
FIG. 9 is a diagram illustrating a hardware configuration of the apparatus for calculating battery power according to the embodiment of the present invention.

FIG. 9 is a diagram illustrating a hardware configuration of the apparatus for calculating battery power according to the embodiment of the present invention.

Referring to FIG. 9, a battery management system 900 may include a microcontroller unit (MCU) 910 that controls various processing and each configuration, a memory 920 in which an operating system program and various programs (e.g., a battery pack abnormality diagnosis program or a battery pack temperature estimation program) are recorded, an input/output interface 930 that provides input interface and output interface between a battery cell module and/or a semiconductor switching device, and a communication interface 940 capable of communicating with the outside through a wired or wireless communication network. As described above, a computer program according to the present invention may be recorded in the memory 920 and processed by the microcontroller 910, thereby capable of being implemented as, for example, a module that performs each functional block illustrated in FIGS. 2 and 4.

In the above description, just because all constituent elements constituting an embodiment of the present invention are described as being combined into one or operating in combination, the present invention is not necessarily limited to these embodiments. That is, as long as it is within the scope of the object of the present invention, all constituent elements may be selectively combined and operated in one or more.

In addition, the terms such as "include", "configure" or "have" described above mean that the corresponding constituent element may be embedded unless otherwise described, and thus the terms should be interpreted as being capable of further including other constituent elements, rather than excluding other constituent elements. All terms used herein including technical or scientific terms may have the same meaning as generally understood by a person of ordinary skill in the art, unless otherwise defined. Terms generally used, such as terms defined in the dictionary, should be interpreted as being consistent with the meaning of the context of related technology, and are not to be interpreted as an ideal or excessively formal meaning unless explicitly defined in the present invention.

The above description is merely illustrative of the technical idea of the present invention, and those of ordinary skill in the art to which the present invention pertains will be able to make various modifications and variations without deviating from the essential characteristics of the present invention. Accordingly, the embodiments disclosed in the present invention are not intended to limit the technical idea of the present invention, but to explain the technical idea, and the scope of the technical idea of the present invention is not limited by these embodiments. The scope of protection of the present invention should be interpreted by the claims set forth below, and all technical ideas within the scope equivalent thereto should be construed as being included in the scope of the present invention.

The invention claimed is:

1. An apparatus for calculating battery power comprising:
   a timer configured to set a target duration of time for using a battery cell;
   a temperature sensor configured to measure a temperature of the battery cell; and
   a controller configured to:
      determine a resistance of the battery cell;
      in response to the target duration of time being set by the timer, calculate a current value of the battery cell at which the battery cell is usable for the target duration of time without exceeding a threshold temperature of the battery cell, wherein the current value is calculated based on the measured temperature and the determined resistance of the battery cell; and
      control operation of the battery cell at the current value.

2. The apparatus of claim 1, further comprising:
   memory configured to store a parameter for calculating the current value of the battery cell.

3. The apparatus of claim 1,
   wherein the controller is configured to determine the resistance of the battery cell based at least in part on a change in resistance according to the measured temperature of the battery cell.

4. The apparatus of claim 3,
   wherein the controller is configured to determine the resistance of the battery cell based on a correction coefficient calculated according to a ratio between resistance at a current temperature of the battery cell and resistance at the threshold temperature of the battery cell.

5. The apparatus of claim 1,
   wherein the controller is configured to determine the resistance of the battery cell in consideration of a change in resistance according to a state of charge (SOC) of the battery cell.

6. The apparatus of claim 5,
   wherein the controller is configured to determine the resistance of the battery cell based on a correction coefficient calculated according to a ratio between resistance at a current SOC of the battery cell and resistance at an SOC of the battery cell after a preset time.

7. The apparatus of claim 1,
   wherein the threshold temperature is a predetermined value or a value determined according to a then-current operation mode of a system including the battery cell.

8. The apparatus of claim 1,
   wherein the controller is configured to calculate the current value based at least in part on a total amount of heat generated from a time that the battery cell is at a current temperature until a time that the battery cell reaches the threshold temperature.

9. The apparatus of claim 1,
   wherein the timer is configured to set the target duration of time in response to an input from a user or an external system.

10. The apparatus of claim 1, wherein the controller is configured to determine the resistance of the battery cell based at least in part on a prestored resistance value.

11. A method for calculating battery power comprising:
   setting a target duration of time for using a battery cell;
   measuring a temperature of the battery cell;
   determine a resistance of the battery cell;
   in response to the target duration of time being set, calculating a current value of the battery cell at which the battery cell is usable for the target duration of time without exceeding a threshold temperature of the battery cell, wherein the current value is calculated based on the measured temperature and determined resistance of the battery; and
   controlling operation of the battery cell at the calculated current value.

12. The method of claim 11,
   wherein determining the resistance of the battery cell is based at least in part on a change in resistance according to the temperature of the battery cell.

13. The method of claim 11,
   wherein determining the resistance of the battery cell is based at least in part on a change in resistance according to an SOC of the battery cell.

14. The method of claim 11, wherein determining the resistance of the battery cell is based at least in part on a prestored resistance value.

* * * * *